United States Patent
Jin et al.

(10) Patent No.: US 11,731,321 B2
(45) Date of Patent: Aug. 22, 2023

(54) METHOD FOR PREPARING MICROGROOVE ARRAY SURFACE WITH NEARLY CYLINDRICAL SURFACE BASED ON AIR MOLDING METHOD

(71) Applicant: Jiangsu University, Jiangsu (CN)

(72) Inventors: Weifeng Jin, Jiangsu (CN); Jian Li, Jiangsu (CN); Xin Ju, Jiangsu (CN); Lamei Wang, Jiangsu (CN)

(73) Assignee: Jiangsu University, Jiangsu (CN)

( * ) Notice: Subject to any disclaimer, the term of this patent is extended or adjusted under 35 U.S.C. 154(b) by 0 days.

(21) Appl. No.: 17/629,788

(22) PCT Filed: Aug. 18, 2021

(86) PCT No.: PCT/CN2021/113161
§ 371 (c)(1),
(2) Date: Jan. 25, 2022

(87) PCT Pub. No.: WO2022/068448
PCT Pub. Date: Apr. 7, 2022

(65) Prior Publication Data
US 2022/0355515 A1 Nov. 10, 2022

(30) Foreign Application Priority Data
Sep. 29, 2020 (CN) .......................... 202011046923.2

(51) Int. Cl.
*B29C 41/24* (2006.01)
*B29C 33/38* (2006.01)
(Continued)

(52) U.S. Cl.
CPC .......... *B29C 41/24* (2013.01); *B29C 33/3842* (2013.01); *B29C 41/46* (2013.01); *B29K 2083/00* (2013.01); *B29L 2007/008* (2013.01)

(58) Field of Classification Search
CPC ..... B29C 65/16; B29C 64/268; B29C 64/135; B29C 2035/0838; B29C 2043/3634;
(Continued)

(56) References Cited

U.S. PATENT DOCUMENTS 8,335,029 B2* 12/2012 Monadgemi ......... G02B 6/3512
359/221.2
2010/0166964 A1 7/2010 Go et al.

FOREIGN PATENT DOCUMENTS

CN 101481079 * 7/2009
CN 103011063 4/2013
(Continued)

OTHER PUBLICATIONS

"International Search Report (Form PCT/ISA/210)" of PCT/CN2021/113161, dated Nov. 17, 2021, pp. 1-5.
(Continued)

*Primary Examiner* — Stella K Yi
(74) *Attorney, Agent, or Firm* — JCIPRNET

(57) ABSTRACT

The present invention provides a method for preparing a microgroove array surface with a nearly cylindrical surface based on an air molding method, and relates to the technical field of functional surface preparation. The method includes the following steps: (1) preparing a microgroove array surface, uniformly spreading a layer of a liquid polymer film to be formed on the auxiliary plate, and placing a spacer block in an empty position on the microgroove array surface; (2) placing the auxiliary plate spread with the liquid polymer film on the spacer block on the microgroove array surface, maintaining this state, and feeding the auxiliary plate into a vacuum drying oven; and (3), setting a pressure in the vacuum drying oven according to a designed pressure, heating and solidifying the liquid polymer film, and sepa-
(Continued)

rating the microgroove array surface to obtain the microgroove array surface with the nearly cylindrical surface.

4 Claims, 2 Drawing Sheets

(51) Int. Cl.
    *B29C 41/46*     (2006.01)
    *B29K 83/00*     (2006.01)
    *B29L 7/00*     (2006.01)

(58) Field of Classification Search
    CPC ........ B29C 2043/023; B29C 2043/022; B29C 37/0057; B29C 33/42; B29C 2059/023; B29C 2043/025; B29C 41/46; B29C 33/3842; B29C 41/24
    See application file for complete search history.

(56) References Cited

FOREIGN PATENT DOCUMENTS

| CN | 103030099 | | 4/2013 |
|---|---|---|---|
| CN | 103030104 | | 4/2013 |
| CN | 110385521 | * | 10/2019 |
| CN | 112225172 | | 1/2021 |

OTHER PUBLICATIONS

"Written Opinion of the International Searching Authority (Form PCT/ISA/237)" of PCT/CN2021/113161, dated Nov. 17, 2021, 2020, pp. 1-5.

\* cited by examiner

METHOD FOR PREPARING MICROGROOVE ARRAY SURFACE WITH NEARLY CYLINDRICAL SURFACE BASED ON AIR MOLDING METHOD

CROSS-REFERENCE TO RELATED APPLICATION

This application is a 371 of international application of PCT application serial no. PCT/CN2021/113161, filed on Aug. 18, 2021, which claims the priority benefit of China application no. 202011046923.2, filed on Sep. 29, 2020. The entirety of each of the above mentioned patent applications is hereby incorporated by reference herein and made a part of this specification.

BACKGROUND

Technical Field

The present invention relates to the technical field of functional surface preparation, and in particular to a method for preparing a microgroove array surface with a nearly cylindrical surface based on an air molding method. The method is suitable for preparing a polymer microgroove array surface with a nearly cylindrical surface, and especially suitable for preparing a microgroove array surface with a nearly cylindrical surface under simple conditions.

Description of Related Art

A microgroove array surface with a nearly cylindrical surface refers to a surface with a microgroove array structure with a nearly cylindrical surface. The microgroove array surface can be used as a texture friction pair, and can also be used as a template for preparing a surface with a micro-convex prismatic array structure with a nearly cylindrical surface to prepare micro-cylindrical lenses in the optical field. It has attracted wide attention in recent years.

The surface quality of the microgroove is of great significance for the microgroove array surface with a nearly cylindrical surface. However, it is difficult to guarantee the surface quality through processing and chemical etching since the microgroove array is micron-scale. In order to prepare a microgroove or a micro-convex prism with a nearly cylindrical surface, a transfer method is generally used to arrange formed droplets drop by drop on a smooth surface, and then the arranged droplets are solidified by a thermal curing method to form a nearly cylindrical surface structure. In this method, it is difficult to control the volume and shape of the droplet. The patent (ZL200910024713.0) provides an air molding method for preparing a near-spherical crown structure, and prepares a nano-scale near-spherical crown pit array, but it can only be realized on a microwell array template. Different from the microwell array template, the difficulty in preparing a microgroove array with a nearly cylindrical surface on a microgroove array template by the air molding method is to control the spreading of liquid inside the groove of the template. During air molding, a formed liquid polymer is dropwise added to the surface of the template and then spread on the surface. For the microwell array template, due to the liquid sealing effect, in this spreading process, it is difficult to remove the air inside the microwell, which provides a guarantee for the air molding method. However, for the microgroove array, the formed polymer will be filled into the groove during spreading to exhaust air inside the groove, resulting in the failure of the air molding method. As shown in FIG. 1, the formed polymer droplet 3 is easily filled into the microgroove 2. Therefore, only by controlling the spreading of the formed liquid polymer inside the groove through a certain method, can the microgroove with the nearly cylindrical surface be prepared by the air molding method.

In short, a method for preparing a micro-nano lens array is provided in the previous work, but this method can only use a well array as a template, and when a groove array is used as the template, the spreading of the formed liquid polymer inside the groove makes the air molding method ineffective, so that it is difficult to prepare a microgroove array surface with a nearly cylindrical surface. In order to prepare the microgroove array surface with the nearly cylindrical surface, the present invention provides an air molding method based on pre-spreading of an auxiliary plate.

SUMMARY

An objective of the present invention is to provide an air molding method based on pre-spreading of an auxiliary plate for preparing a microgroove array surface with a nearly cylindrical surface, which realizes controllable preparation of a polymer material microgroove array surface with a nearly cylindrical surface under simple conditions.

The present invention is achieved through the following technical solution.

An air molding method based on pre-spreading of an auxiliary plate for preparing a microgroove array surface with a nearly cylindrical surface includes the following steps:

(1) preparing a microgroove array surface, uniformly spreading a layer of a liquid polymer film to be formed on the auxiliary plate, and placing a spacer block in an empty position on the microgroove array surface;

(2) placing the auxiliary plate spread with the liquid polymer film on the spacer block on the microgroove array surface, maintaining this state, and feeding the auxiliary plate into a vacuum drying oven; and (3) setting a pressure in the vacuum drying oven according to a designed pressure, heating and solidifying the liquid polymer film, and separating the microgroove array surface to obtain the microgroove array surface with the nearly cylindrical surface.

In the above step (1) of the method, the microgroove array surface is prepared by a conventional micro-processing method such as a laser direct writing processing method, where a laser spot used has a diameter of 5-100 µm, an overlap rate of the laser spot during scanning falls within 30-90%, a groove zone to be processed is subjected to surface scanning 5-20 times, and a prepared microgroove has a depth greater than a width of the microgroove.

In the above step (1) of the method, uniformly spreading the layer of the liquid polymer film to be formed on the auxiliary plate specifically includes: dripping a liquid polymer material polydimethylsiloxane (PDMS) on the auxiliary plate, and freely spreading the liquid polymer with a required thickness for 10-300 s to form the liquid polymer film with a thickness of 50-1,500 µm, and a spreading area of the liquid polymer film being configured for completely covering the microgroove array surface.

In the above step (1) of the method, placing the spacer block in the empty position on the microgroove array surface specifically includes: preparing three spacer blocks with a thickness less than a thickness of the liquid polymer film by 10-50 µm and a length and a width between 1×1 mm and 5×5 mm, and placing the three spacer blocks in empty positions near edges of the microgroove array surface, the three spacer blocks being placed scatteredly, and lines between the spacer blocks forming an acute triangle.

In the above Step (2) of the method, placing the auxiliary plate spread with the liquid polymer film on the spacer block on the microgroove array surface, maintaining this state, and feeding the auxiliary plate into the vacuum drying oven specifically includes: placing the auxiliary plate spread with the liquid polymer film on the spacer block on the microgroove array surface, making the liquid polymer come into contact with the microgroove array surface to achieve liquid seal on air in the microgroove, keeping the microgroove array surface horizontal in subsequent operations to limit flow of the liquid polymer film, keeping the liquid polymer film and the microgroove array surface in full contact and at a horizontal state, and feeding the liquid polymer film and the microgroove array surface into the vacuum drying oven for later treatment.

In the above Step (3) of the method, setting the pressure in the vacuum drying oven according to the designed pressure, heating and solidifying the liquid polymer film, and separating the microgroove array surface to obtain the microgroove array surface with the nearly cylindrical surface specifically includes: calculating the pressure $P=P_0-\sigma/r$ of the vacuum drying oven according to a designed curvature radius r of the microgroove with the nearly cylindrical surface, where $P_0$ is an atmospheric pressure and $\sigma$ is a surface tension of the liquid formed polymer film; vacuumizing the vacuum drying oven to the calculated pressure P; adjusting a temperature to 60° C. and performing heat preservation for 2 hours to solidify the formed polymer film; and performing natural cooling after solidification, and separating the prepared solidified film from a microgroove template and the auxiliary plate to obtain the microgroove array surface with the nearly cylindrical surface.

The present invention has the following advantages.

The liquid polymer is pre-spread through the auxiliary plate, and the problem that the air molding method is difficult to apply due to the filling and exhausting of the microgroove when the liquid polymer is spread on the microgroove array surface is solved.

The microgroove array surface with the nearly cylindrical surface is prepared by the air molding method. The internal surface quality of the prepared microgroove is determined by the quality of a liquid-air interface. Therefore, a smoother internal surface of the microgroove can be achieved, which is beneficial to the application in the optical field.

1—microgroove array surface, 2—microgroove, 3—formed polymer droplet, 4—auxiliary plate, 5—liquid polymer film, 6—formed polymer liquid between auxiliary plate and microgroove array surface, 7—formed polymer liquid subjected to vacuumizing, 8—microgroove array surface with a nearly cylindrical surface, 9—spacer block, and 10—acute triangle formed among spacer blocks.

DESCRIPTION OF THE EMBODIMENTS

Figure 1:
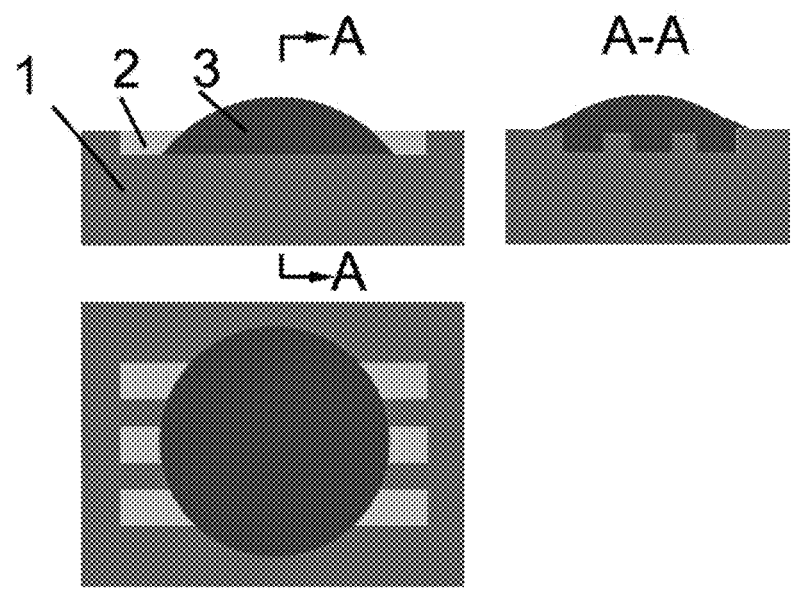
FIG. 1 is a principle of air escape from a microgroove caused by spreading of a formed polymer.
Figure 2:
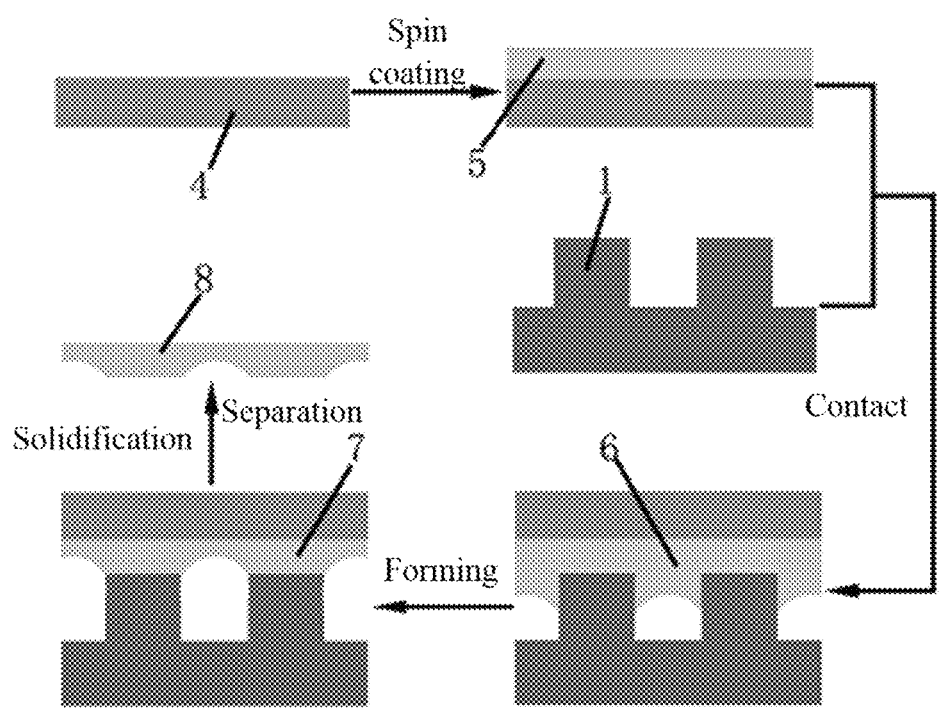
FIG. 2 is an implementation flow of a method for preparing a microgroove array surface with a nearly cylindrical surface based on an air molding method.
Figure 3:
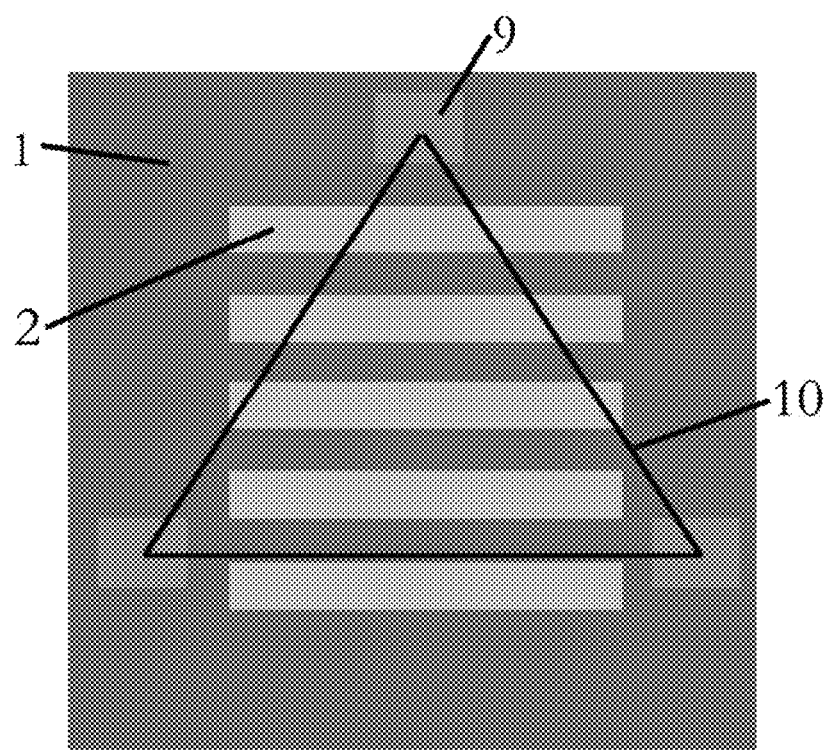
FIG. 3 is a placement manner of spacer blocks on a microgroove surface.

The following describes implementation details and working conditions of a specific technology provided by the present invention with reference to FIG. 2 and FIG. 3.

An air molding method based on pre-spreading of an auxiliary plate for preparing a microgroove array surface with a nearly cylindrical surface is shown in FIG. 2, and includes four steps: preparing a microgroove array surface, pre-spreading a liquid formed polymer on the auxiliary plate, making the spread liquid formed polymer come into contact with the microgroove array surface to achieve liquid seal, and performing vacuum forming, solidifying and separating operations on the formed polymer to obtain the microgroove array surface with the nearly cylindrical surface based on the air molding method.

Firstly, the microgroove array surface 1 is prepared by a certain method, the surface may be prepared through conventional micro-processing methods such as a laser direct writing processing method and a photoetching processing method, and a prepared microgroove 2 has a depth greater than a width of the microgroove 2. When laser direct writing processing method is used, a laser beam directly acts on a smooth surface, such that a material of a local zone of the smooth surface may be removed, and a specific groove may be obtained by repeatedly removing the material and controlling the laser beam to scan a specific path. When the photoetching processing method is used, firstly, a mask plate is customized, and then a certain smooth base material is coated with photoresist, and then a pattern of the mask plate is projected onto the photoresist through a photoetching exposure system, such that performance of the photoresist changes, and the microgroove array surface 1 is obtained through subsequent technologies such as development, hard baking, corrosion and photoresist removal.

Secondly, a liquid polymer film 5 is pre-spread on the auxiliary plate 4. The auxiliary plate 4 is coated with a layer of the liquid formed polymer film 5 with a thickness of 50-1,500 μm. In the case of a liquid polymer, the microliquid polymer film 5 (with a volume of 50 μL<V<1,500 μL) is poured onto the auxiliary plate 4, and the liquid polymer film is spread with a required thickness (50-1,500 μm) through a spin coater or using the gravity.

Thirdly, the spread liquid polymer film 5 is made to come into contact with the microgroove array surface 1 to form the liquid seal. The microgroove array surface 1 is placed horizontally. Spacer blocks 9 are placed in empty positions of edges of the microgroove array surface 1. As shown in FIG. 3, it is ensured that lines between the spacer blocks form an acute triangle 10 among the spacer blocks, and it is ensured that the spacer block 9 has a thickness less than a thickness of the spread liquid polymer film 5 by 10-50 μm. Then the spread liquid polymer film 5 is in contact with the microgroove array surface 1. At this time, the liquid formed polymer forms a specific shape under the action of the surface tension and air pressure, that is, formed polymer liquid 6 between the auxiliary plate and the microgroove array surface is formed, such that residual air inside the microgroove is sealed by the polymer.

Fourthly, vacuum forming, solidifying and separating operations are performed on the formed polymer, so as to prepare the microstructure through the air molding method. The microgroove array surface 1 in the previous step is kept being horizontally placed and fed into a vacuum drying oven together with the formed polymer liquid 6 between the auxiliary plate and the microgroove array surface and the auxiliary plate 4. The pressure $P=P_0-\sigma/r$ of the vacuum drying oven is calculated according to a designed curvature radius r of the microgroove with the nearly cylindrical surface, $P_0$ is an atmospheric pressure, and $\sigma$ is a surface tension of the formed polymer. The vacuum drying oven is vacuumized to the calculated pressure P, so as to convert the formed polymer liquid into formed polymer liquid 7 subjected to vacuumizing. The formed polymer liquid 7 subjected to vacuumizing is heated and solidified and separated from the auxiliary plate 4 and the microgroove array surface 1. According to the law of the interface pressure and the interface curvature radius in the Laplace equation, the microgroove structure obtained is a microgroove structure with a nearly cylindrical surface, that is, a microgroove array surface with a nearly cylindrical surface 8 is formed.

Embodiment 1 (PDMS is selected as a liquid polymer film 5, a smooth Si surface is selected as an auxiliary plate 4, and a silicon wafer fragment is selected as a spacer block)

An ordinary microgroove array surface 1 is prepared through laser direct writing processing, in which a laser spot used has a diameter of 20 µm, an overlap rate of the laser spot during scanning is 50%, that is, a distance between two consecutive spots is 10 µm, and a microgroove zone to be processed is subjected to surface scanning 10 times. A 1060 aluminum plate is selected as a substrate surface, and the microgroove has a width of 50 µm, a depth of 100 µm, and a groove length of 2 µm after processing. 300 µL of PDMS (purchased from Dow Corning Company, USA, trade name Sylgard 184A) is dropwise added on the auxiliary smooth Si surface. After the PDMS is spread freely for 3 minutes, a smooth and flat silicon wafer coated with the liquid PDMS film can be obtained. The prepared microgroove 1060 aluminum plate is placed horizontally, and three silicon wafer fragments with a thickness of 200 µm are placed at edges of the microgroove 1060 aluminum plate as spacer blocks. Then the silicon wafers spread with the liquid PDMS film are placed on the spacer blocks, such that the residual air inside the microgroove is sealed by the PDMS film. The microgroove 1060 aluminum plate in a horizontal state is, together with the auxiliary smooth Si surface and the liquid PDMS, are fed into a vacuum drying oven. A curvature radius is designed as 50 µm. The vacuum pressure is calculated as 100,925 Pa. Vacuumizing is performed according to the pressure. Heating is performed to 60° C. Heat preservation is kept for 2 hours. Then natural cooling is performed, and the polymer film is separated from the auxiliary plate and the microgroove array surface to obtain a microgroove array surface with a nearly cylindrical surface with a width of 50 µm and a depth of 50 µm.

What is claimed is:

1. An air molding method based on pre-spreading of an auxiliary plate for preparing a microgroove array surface with a nearly cylindrical surface, comprising the following steps:
    step 1: preparing a microgroove array surface; uniformly spreading a layer of a liquid polymer film to be molded on the auxiliary plate; and placing a spacer block at an empty position of the microgroove array surface;
    step 2: placing the auxiliary plate spread with the liquid polymer film on the spacer block on the microgroove array surface, and feeding the auxiliary plate into a vacuum drying oven while maintaining this state;
    step 3: setting a pressure in the vacuum drying oven according to a designed pressure value, heating and solidifying the liquid polymer film, and separating the liquid polymer film from the surface of the auxiliary plate to achieve the preparation of the microgroove array surface with the nearly cylindrical surface;
    in the step 1 of the method, the microgroove array surface is prepared by a conventional micro-processing method such as a laser direct writing processing method, a laser spot being used has a diameter of 5 µm to 100 µm, an overlap rate of the laser spot during scanning falls within 30% to 90%, a groove zone to be processed is subjected to a surface scanning 5 times to 20 times, and the prepared microgroove has a depth greater than a width of the microgroove, and
    wherein in the step 1, placing the spacer block at the empty position of the microgroove array surface is: preparing three spacer blocks with thicknesses less than a thickness of the liquid polymer film by 10-50 µm, and lengths and widths of the spacer blocks ranging from 1×1 mm to 5×5 mm, and placing the three spacer blocks in empty positions near edges of the microgroove array surface, the three spacer blocks being placed scatteredly, and connecting lines between the spacer blocks forming an acute triangle.

2. The air molding method based on the pre-spreading of the auxiliary plate for preparing the microgroove array surface with the nearly cylindrical surface according to claim 1, wherein in the step 1, uniformly spreading the layer of the liquid polymer film to be molded on the auxiliary plate is: dripping a liquid polymer material of polydimethylsiloxane on the auxiliary plate, and freely spreading the liquid polymer material to a required thickness for 10 s to 300 s to form the liquid polymer film with a thickness of 50-1,500 µm, and a spreading area of the liquid polymer film being capable of completely covering the microgroove array surface.

3. The air molding method based on the pre-spreading of the auxiliary plate for preparing the microgroove array surface with a nearly cylindrical surface according to claim 1, wherein in the step 2, placing the auxiliary plate spread with the liquid polymer film on the spacer block on the microgroove array surface, and feeding the auxiliary plate into the vacuum drying oven while maintaining this state is: placing the auxiliary plate spread with the liquid polymer film on the spacer block on the microgroove array surface, making the liquid polymer come into contact with the microgroove array surface to achieve liquid sealing to an air in the microgroove, keeping the microgroove array surface horizontal in subsequent operations to limit a flow of the liquid polymer film, keeping the liquid polymer film and the microgroove array surface in full contact and at a horizontal state, and feeding the liquid polymer film and the microgroove array surface into the vacuum drying oven for being ready to a treatment.

4. The air molding method based on pre-spreading of an auxiliary plate for preparing a microgroove array surface with a nearly cylindrical surface according to claim 1, wherein in the step 3, setting the pressure in the vacuum drying oven according to the designed pressure value, heating and solidifying the liquid polymer material, and separating the liquid polymer film from the surface of the auxiliary plate to achieve the preparation of the microgroove array surface with the nearly cylindrical surface is: calculating the pressure $P=P_0-\sigma/r$ of the vacuum drying oven according to a designed curvature radius r of the microgroove with the nearly cylindrical surface, wherein $P_0$ is an atmospheric pressure and $\sigma$ is a surface tension of the liquid formed polymer, vacuumizing the vacuum drying oven to the calculated pressure P; adjusting a temperature to 60° C. and keeping the temperature for 2 hours to solidify the formed liquid polymer film; and performing natural cooling after solidification, and separating the prepared solidified film from a microgroove template and the auxiliary plate to obtain the microgroove array surface with the nearly cylindrical surface.

* * * * *